United States Patent
Jang et al.

(10) Patent No.: US 7,213,222 B2
(45) Date of Patent: May 1, 2007

(54) METHOD OF HDL SIMULATION CONSIDERING HARD MACRO CORE WITH NEGATIVE SETUP/HOLD TIME

(75) Inventors: Mi-Sook Jang, Yongin-si (KR); Hoi-Jin Lee, Sungnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 219 days.

(21) Appl. No.: 10/867,726

(22) Filed: Jun. 16, 2004

(65) Prior Publication Data

US 2005/0028116 A1 Feb. 3, 2005

(30) Foreign Application Priority Data

Jul. 31, 2003 (KR) .................. 10-2003-0053152

(51) Int. Cl.
*G06F 17/50* (2006.01)
(52) U.S. Cl. ........................................ 716/6
(58) Field of Classification Search .............. 716/4, 716/10; 703/19, 14
See application file for complete search history.

(56) References Cited

U.S. PATENT DOCUMENTS

| | | | | |
|---|---|---|---|---|
| 4,907,180 A | * | 3/1990 | Smith ........................... | 703/14 |
| 5,095,454 A | * | 3/1992 | Huang ........................... | 703/19 |
| 5,548,539 A | | 8/1996 | Vlach et al. | |
| 5,586,046 A | | 12/1996 | Feldbaumer et al. | |
| 5,768,159 A | * | 6/1998 | Belkadi et al. ................ | 703/19 |
| 6,367,060 B1 | * | 4/2002 | Cheng et al. .................. | 716/10 |

FOREIGN PATENT DOCUMENTS

KR 1999-0079355 11/1999

* cited by examiner

*Primary Examiner*—Leigh M. Garbowski
(74) *Attorney, Agent, or Firm*—Harness, Dickey & Pierce, PLC

(57) ABSTRACT

A method of HDL simulation is described, which may enhance HDL simulation accuracy by allowing a simulator to process a negative setup time and/or hold time. For an electronic circuit device negative setup time and/or a negative hold time, a simulation may be executed without altering the negative setup time and/or hold time to be interpreted as zero. A setup time and/or hold time may be negative relative to a particular clock cycle while being positive relative to another clock cycle. Incorporating the value of the negative setup time and/or hold time without altering its value to zero may increase the accuracy of HDL simulations.

18 Claims, 8 Drawing Sheets

METHOD OF HDL SIMULATION CONSIDERING HARD MACRO CORE WITH NEGATIVE SETUP/HOLD TIME

This U.S. non-provisional patent application claims priority under 35 U.S.C. § 119 of Korean Patent Application 2003-53152 filed on Jul. 31, 2003, the contents of which are hereby incorporated by reference in its entirety.

BACKGROUND OF THE INVENTION

1. Field of the Invention

The present invention generally relates to hardware description language (HDL), and more particularly to HDL simulations with negative setup and/or hold times.

2. Description of the Related Art

Hardware description language (HDL) may be used in designing all types of electronic circuits. These electronic circuits may include application specific integrated circuits (ASICs) and/or very large scale integration (VLSI) circuits. HDL may allow each described Hard Macro Core (HMC) to have connections to other HMCs and/or the function of the interacting HMCs may be simulated. Simulation for approximating the function of an electronic circuit may be used before the electronic circuit goes into production.

In a conventional HDL method, a HMC may be integrated with other circuit elements and then simulated. A timing model of the HMC may be produced as one step in the simulation process. The timing model may have timing information that relates at least one pin connected to the HMC. The timing information may include parameters, for example a setup time and/or a hold time, with respect to each pin.

HDL simulation may not permit a negative number to represent a negative parameter, such as the setup time and/or hold time. Therefore, in conventional methods, a value of zero instead of a negative value may be used to represent setup time and/or hold time. However, this may provide a less accurate simulation as a negative setup time and/or hold time may exist relative to a signal.

SUMMARY OF THE INVENTION

In an exemplary embodiment, the present invention provides an improved HDL simulation which is capable of incorporating a negative setup time and/or a negative hold time.

In an exemplary embodiment, the present invention provides a method of HDL simulation for simulating a HMC. According to this exemplary embodiment, it is determined whether the HMC comprises a device for receiving a signal with a negative setup time. Following this determination, a second electronic circuit device is generated for receiving the signal.

In an exemplary embodiment, the present invention provides a method of HDL simulation for simulating a HMC. According to this exemplary embodiment, it is determined whether there is a first electronic circuit device for receiving a first clock signal and a first signal with a negative hold time. Following this determination, a second clock signal having a phase preceding a phase of the first clock signal is generated.

In an exemplary embodiment, the present invention provides a method of HDL simulation for simulating a HMC. According to this exemplary embodiment, it is determined whether there is a first electronic circuit device for receiving a signal with at least one negative parameter. A second electronic circuit device is then generated for receiving the signal without losing accuracy.

In an exemplary embodiment, the present invention provides a method of HDL simulation for simulating a HMC. According to this exemplary embodiment, it is determined whether there is a first electronic circuit device for receiving a first signal with a negative parameter. Following this determination, a second signal having a phase preceding a phase of the first signal is generated when the first signal is determined to have a negative parameter.

In another exemplary embodiment, the present invention provides a computer program comprising a computer-readable medium having computer program logic stored thereon for enabling a process to perform HDL simulation. According to this exemplary embodiment, it is determined whether there is a first electronic circuit device for receiving a first signal with a negative parameter. A second electronic circuit device is then generated to receive the first signal without losing accuracy.

In another exemplary embodiment, the present invention provides a computer program comprising a computer-readable medium having computer program logic stored thereon for enabling a process to perform HDL simulation. According to this exemplary embodiment, it is determined whether there is a first electronic circuit device for receiving a first signal with a negative parameter. A second signal to which the negative hold time of the first electronic device with respect to the first signal would not be negative is generated. The first electronic device for receiving the first and second signals is then generated.

In another exemplary embodiment, the present invention provides a method of HDL simulation for simulating a HMC. According to this exemplary embodiment, it is determined whether there is a first electronic circuit device for receiving a signal with a negative parameter. Following this determination, a second electronic circuit device is generated for receiving the signal with a negative parameter without losing accuracy.

DETAILED DESCRIPTION OF EXEMPLARY EMBODIMENTS

Hereinafter, exemplary embodiments of the present invention will be described in detail with reference to the accompanying drawings.

Figure 1:
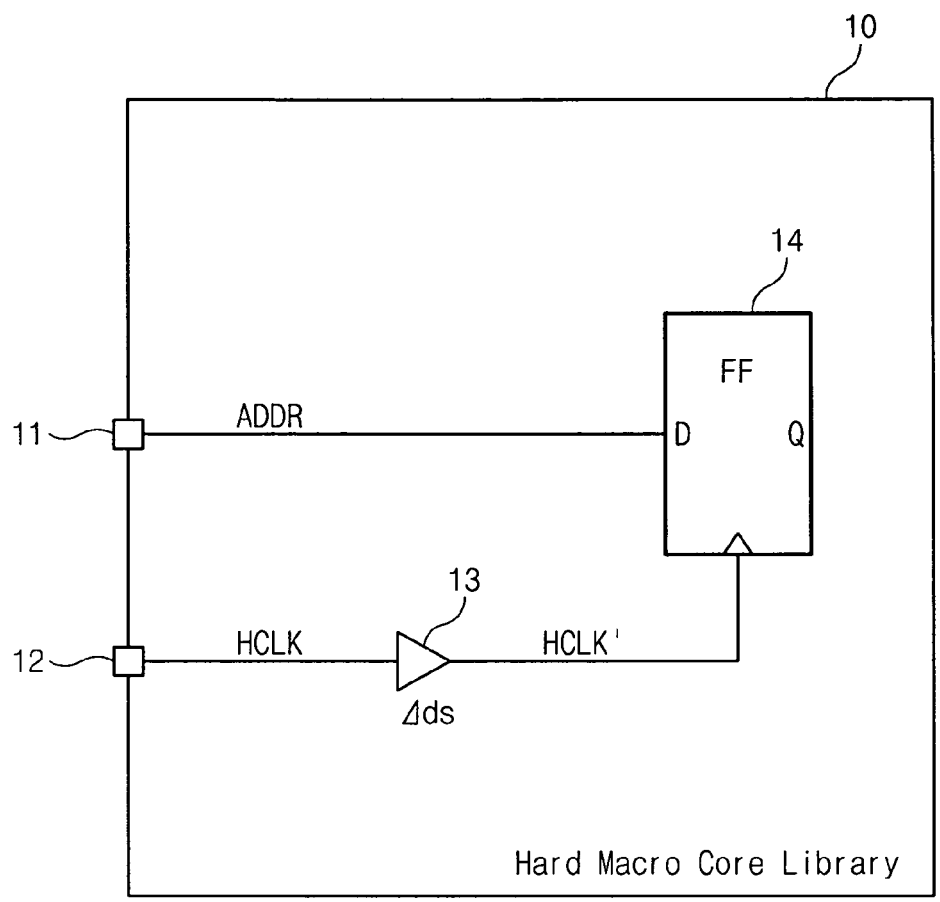
FIG. 1 illustrates an exemplary embodiment of a HMC.

FIG. 1 illustrates an exemplary embodiment of a HMC. Referring to FIG. 1, the HMC 10 may include input terminals 11 and 12 and a flip-flop 14. The input terminals 11 and 12 receives an address signal ADDR and a clock signal HCLK. The clock signal HCLK inputted through the input terminal 12 is delivered to a clock terminal of the flip flop 14 after a clock tree synthesis (CTS) is applied thereto. A buffer 13 in FIG. 1 is generated as the result of the CTS. The flip flop 14 latches an address signal ADDR in response to a clock signal HCLK' which is delayed from the clock signal HCLK by the buffer 13.

Figure 2:
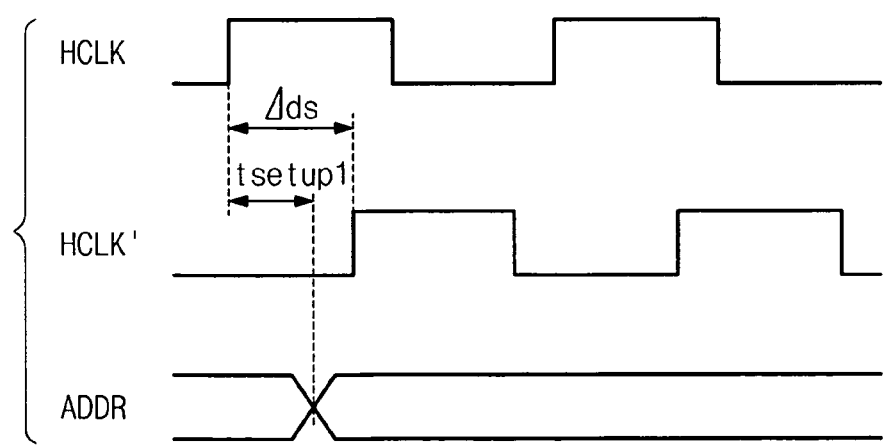
FIG. 2 illustrates a negative setup time of the HMC library shown in FIG. 1.

FIG. 2 illustrates an exemplary embodiment of a negative setup time of the HMC library shown in FIG. 1. Referring to FIG. 2, the clock signal HCLK' is outputted from the buffer 13 and inputted into the flip flop 14, and it is delayed by Δds. The Δds refers to the time difference of when HCLK' is inputted into the flip flop 15 compared to the clock signal HCLK inputted through the input terminal 12.

With respect to the flip flop 14, the address signal ADDR is stabilized at a rising edge of the delayed clock signal HCLK', such that an operation of the flip flop 14 may be performed. However, because the timing model file with respect to the HMC is generated based on the signals inputted through the input terminals 11 and 12 of the HMC, the setup time may be determined to be negative. A setup time (tsetup1) of the signal ADDR inputted through the input terminal 11 may be negative with respect to the clock signal HCLK.

Figure 3:
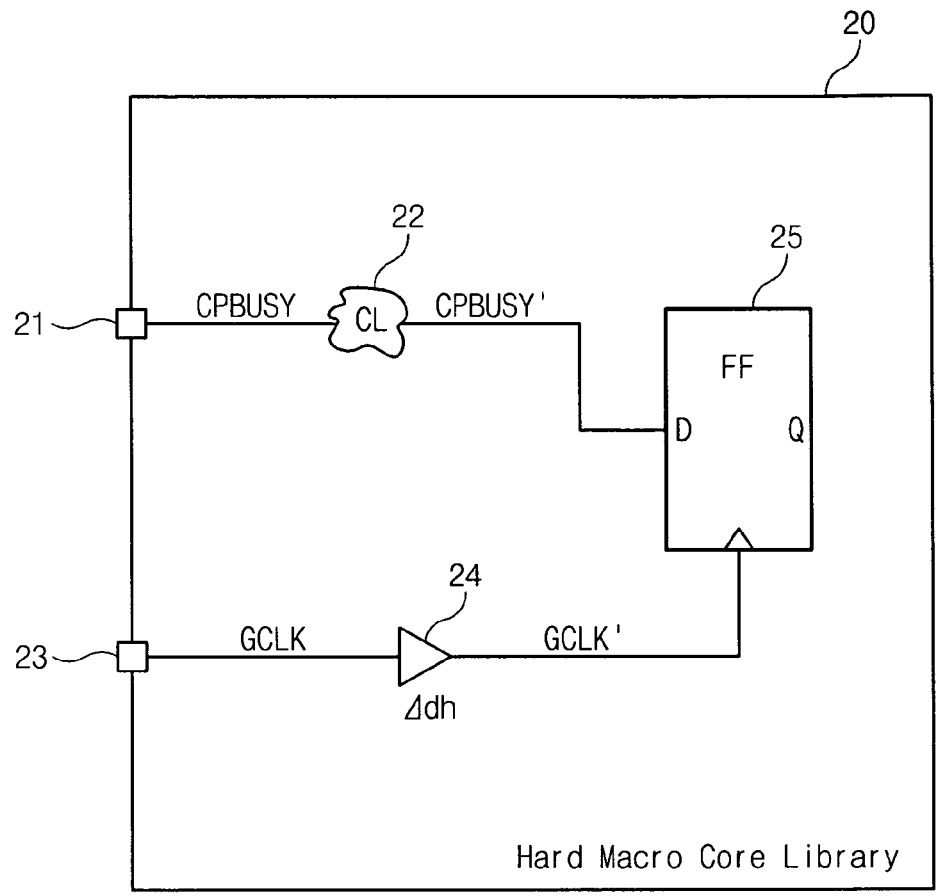
FIG. 3 illustrates another exemplary embodiment of a HMC.

FIG. 3 is another exemplary embodiment of a HMC. Referring to FIG. 3, the HMC 20 may include input terminals 21 and 23 for receiving a signal CPBUSY and a clock signal GCLK, respectively. The HMC 20 may further include a combination logic CL circuit 22 and a flip flop 25. The clock signal GCLK inputted through the input terminal 23 is applied to a clock terminal of the flip flop 25 after the CTS is performed. In FIG. 3, the buffer 24 is a device generated by the CTS. The signal CPBUSY inputted through the input terminal 21 is delayed by the CL circuit 22 and then outputted. The flip flop 25 latches a signal CPBUSY' from the CL circuit 22 in response to a clock signal GCLK' that is delayed by the buffer 24 with a delay time Δdh from the clock signal GCLK inputted from the input terminal 23.

Figure 4:
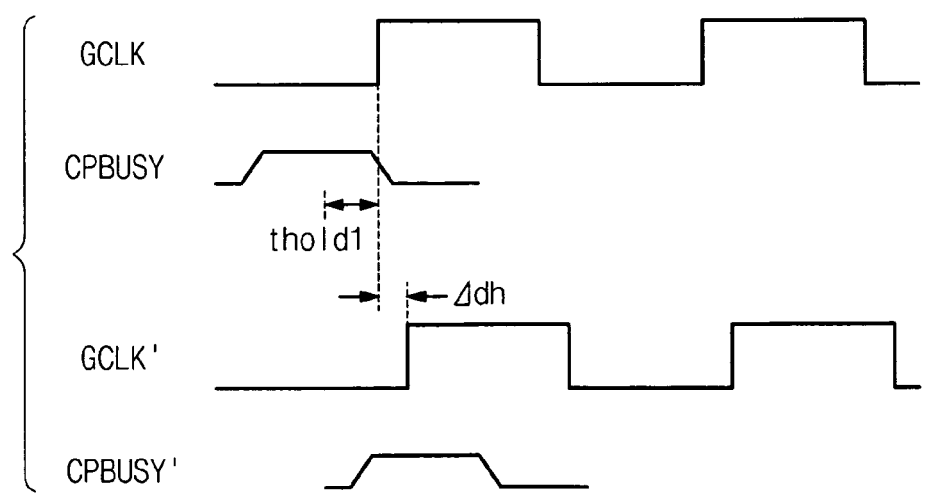
FIG. 4 illustrates a negative hold time of the HMC library shown in FIG. 3.

FIG. 4 illustrates a an exemplary embodiment of a negative hold time of the HMC library shown in FIG. 3. Referring to FIG. 4, the clock signal GCLK' that is outputted from the buffer 24 and inputted into the flip flop 25 is received after the clock signal GCLK is received by the input terminal 23. The delay after which the GCLK' is received with respect to when GCLK is received is illustrated by Δdh.

With respect of the flip flop 25 of FIG. 3, a signal CPBUSY' has a stable value at a rising edge of the clock signal GCLK', such that the flip flop 25 may operates normally at the rising edge of the clock signal GCLK'. However, the timing model file with respect to the HMC is generated based on the signals GCLK and CPBUSY, which are received by input terminals 21 and 23, respectively, such that a hold time thold1 of the signal CPBUSY is determined to be negative.

Figure 5:
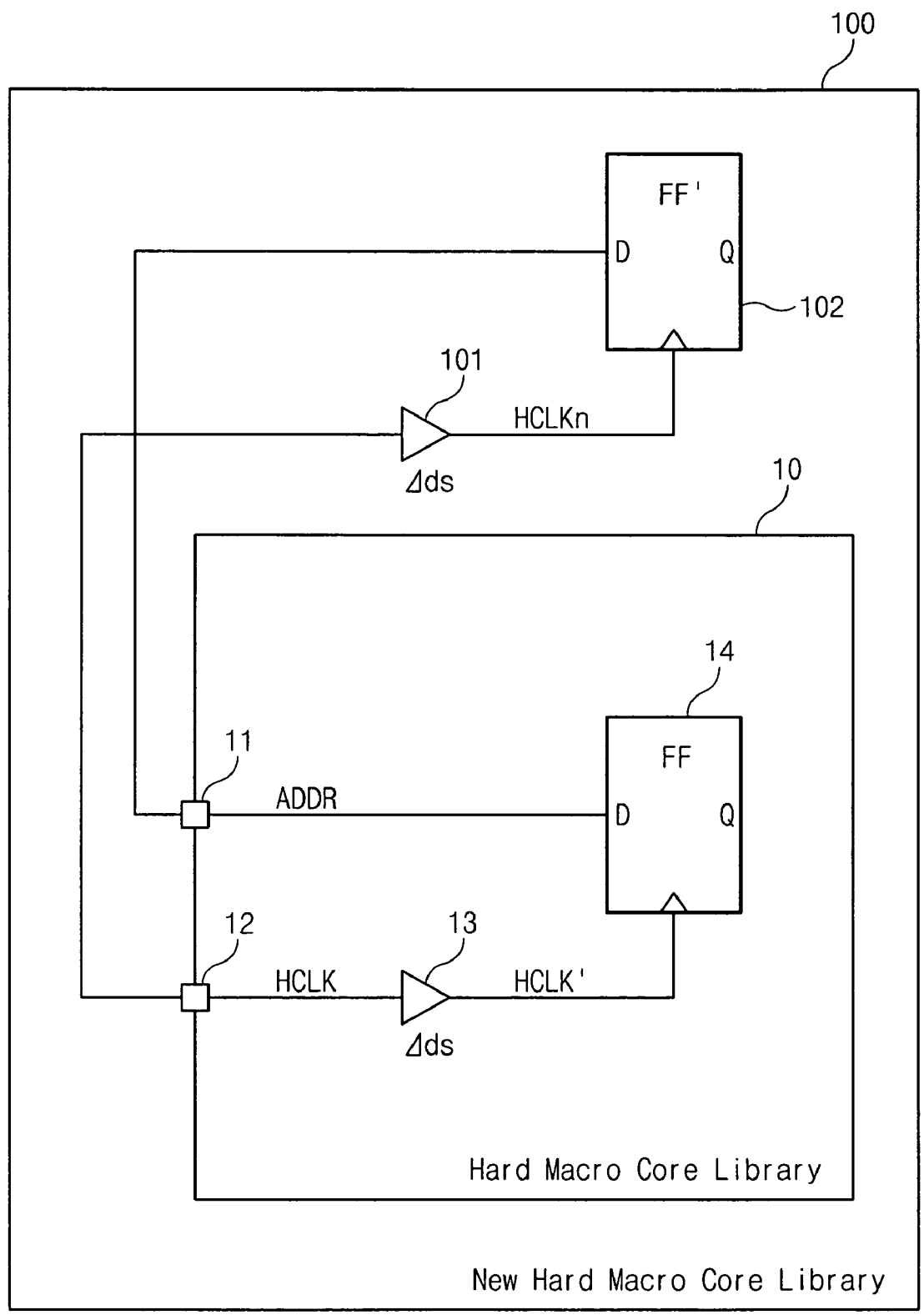
FIG. 5 illustrates a an exemplary method of simulating the HMC.

FIG. 5 illustrates an exemplary method of simulating a HMC.

As explained above with reference to FIG. 1, the HMC 10 may include input terminals 11 and 12 for receiving an address signal ADDR and a clock signal HCLK, respectively, and a flip flop 14. The clock signal HCLK received by input terminal 12 is applied to a clock terminal of the flip flop 14 after the CTS is performed. The buffer 13 is a device generated by the CTS. The flip flop 14 latches the address signal ADDR in response to a clock signal HCLK'. The clock signal HCLK' is generated from a buffer 13 after a delay time lapses from the clock signal HCLK inputted through a terminal 12.

In another exemplary embodiment of the present invention, a new HMC library 100 is generated. The HMC library 100 may measure the setup time of the signals ADDR and HCLK received by the input terminals 11 and 12 of the HMC 10.

Figure 9A:
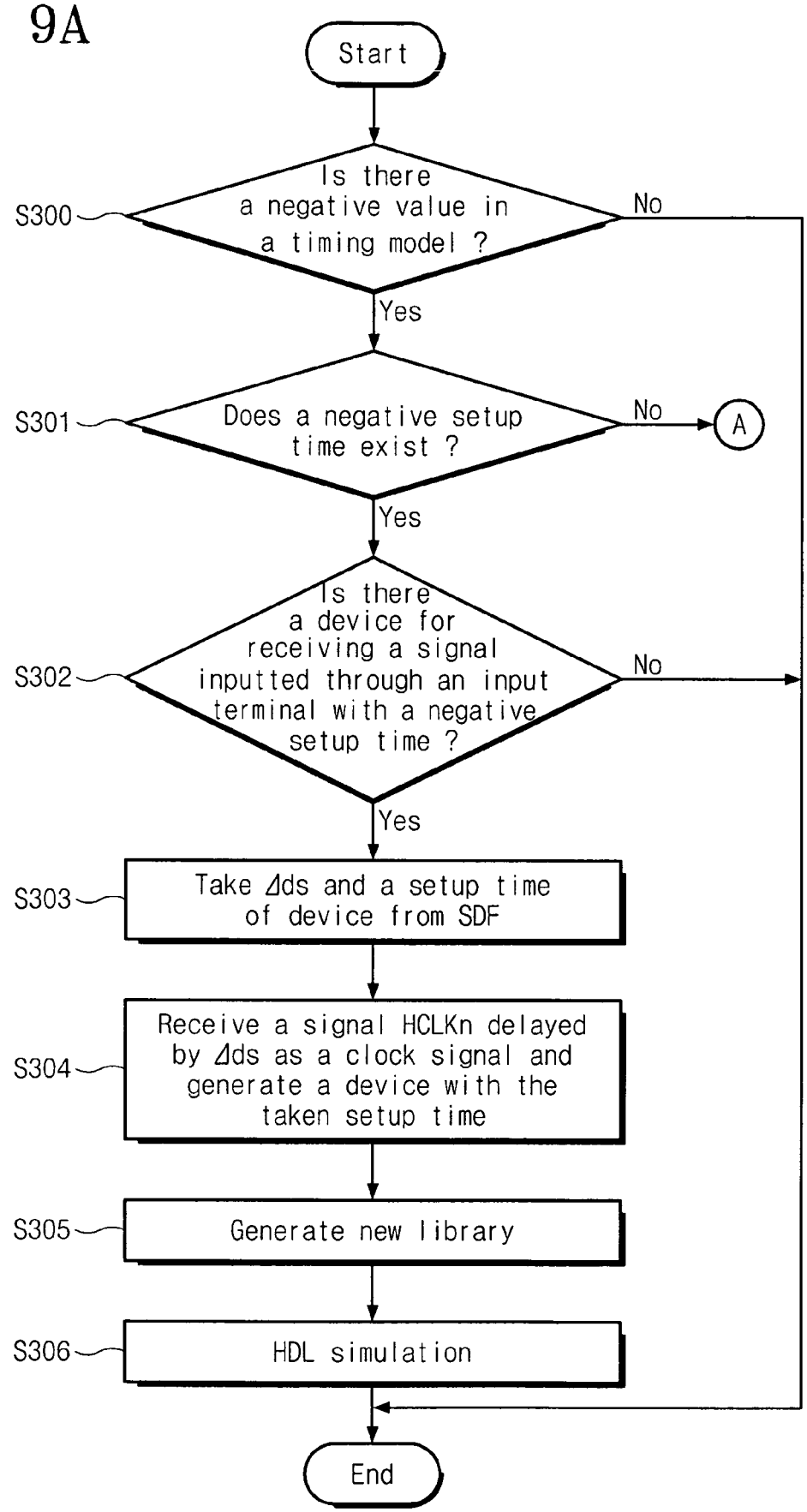
FIGS. 9A and 9B are flowcharts illustrating a HDL simulation process of the HMC with a negative setup time and a negative hold time.
Figure 9B:
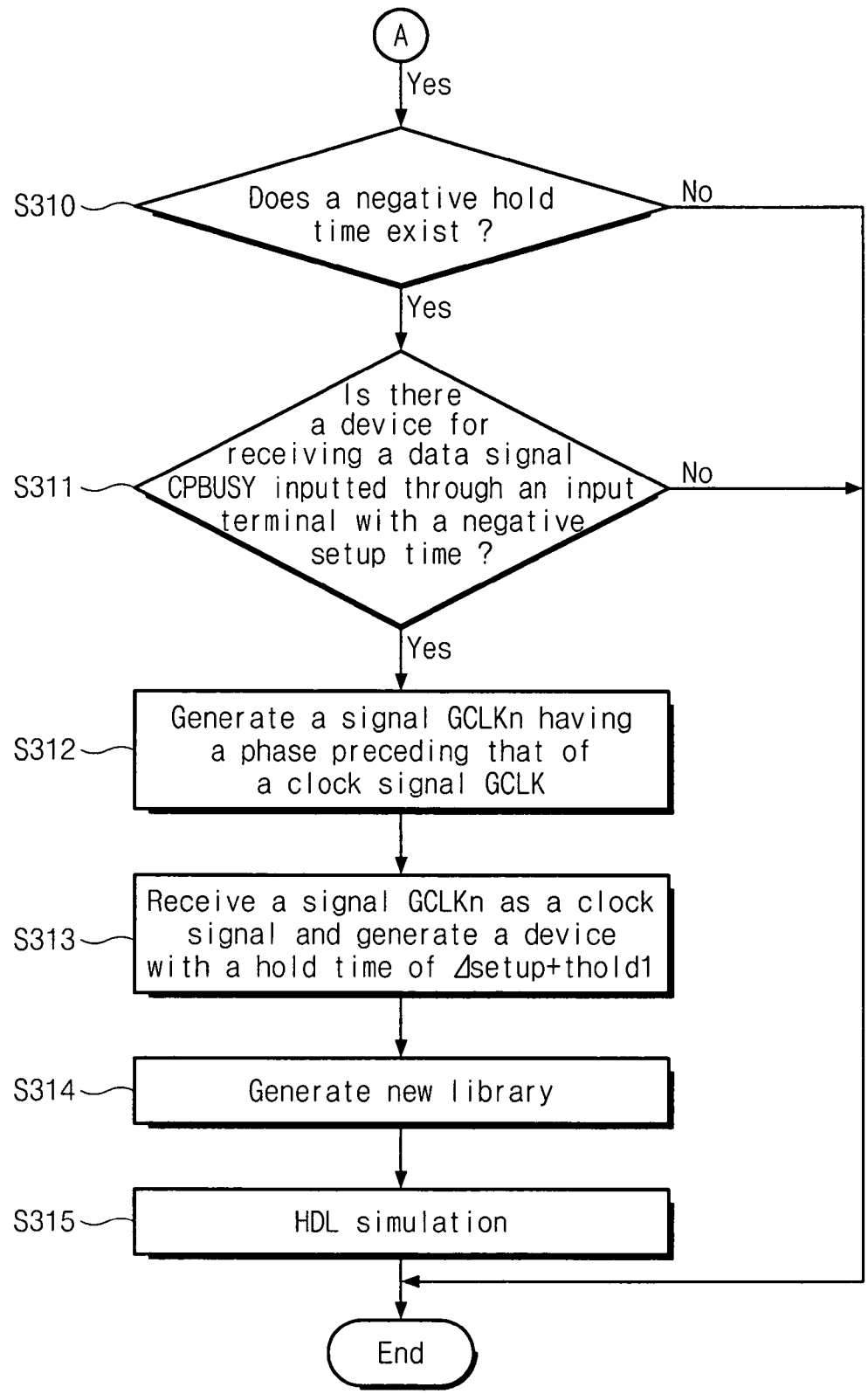

An exemplary method of generating the new HMC library 100 by accurately measuring a setup time is illustrated in FIGS. 9A and 9B.

Referring to FIG. 9A, in S300, it is determined whether the timing model file includes a negative value. As explained above, the timing model file includes timing information with respect to a pin of the HMC for interfacing with external elements. The timing information is generated incorporating a setup time and a hold time with respect to each pin. If a determination is made that there is a negative value for either a setup time or a hold time, the control proceeds to S301.

In S301, a determination is made on whether the negative value of the setup time and/or hold time existing in the timing model file includes a negative setup time. If a negative setup time is determined to exist, the control proceeds to S302. If a negative setup time is determined not to exist, the control proceeds to S310.

In S302, a determination is made of whether there is a device for receiving the signal ADDR received by an input terminal with a negative setup time. In this embodiment, the flip flop 14 receives the signal ADDR.

In S303, a standard delay file (SDF) is extracted out from the HMC 10. The SDF includes a delay time Δds between a clock signal HCLK and a clock signal HCLK' and a setup time of the flip flop 14. The clock signal HCLK is received by the input terminal 12 of the HMC 10. The clock signal HCLK' is received by a clock input terminal of the flip flop 14. The setup time of the flip flop 14 refers a time that the signal ADDR is received by an input terminal D prior to a rising edge of the clock signal HCLK'. The address signal ADDR should be in a state at a rising edge of the clock signal HCLK' to ensure a stable operation of the flip flop 14.

Figure 6:
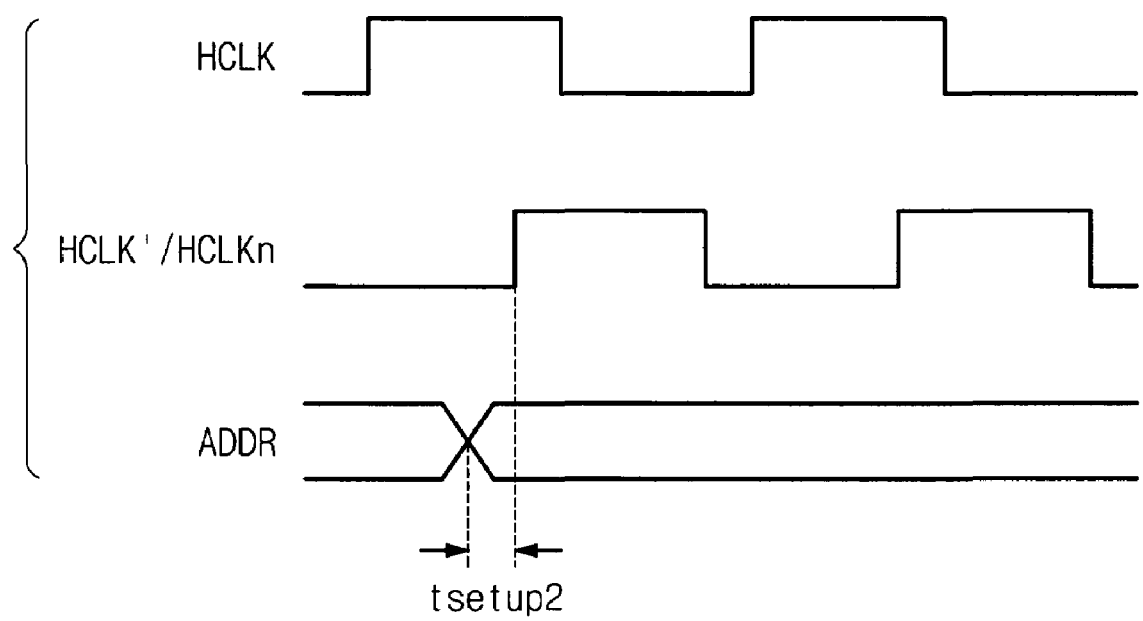
FIG. 6 illustrates a setup time of the HMC library shown in FIG. 5.

In S304, the clock signal HCLKn is delayed from the clock signal HCLK by a delay time Δds. HCLKn is received as a clock signal. A flip flop 102 is generated, which has the same setup time as that of the flip flop 14 achieved from the SDF. As illustrated in FIG. 6, a phase and a frequency of the clock signal HCLKn inputted from the flip flop 102 are the same as those of the clock signal HCLK' inputted from the flip flop 14.

In S305, as illustrated in FIG. 5, a HMC library 100 is generated. HMC 100 as illustrated in FIG. 5 integrates a buffer 101 and a flip flop 102 with the HMC library 10. A setup time tsetup2 of the signal ADDR is positive when a timing with respect to a library 100 is checked. Therefore, the HDL simulator can check accurate timing information with respect to the signal ADDR during a simulation of the new library 100.

In S306, the HDL simulation is applied to the generated library 100.

Figure 7:
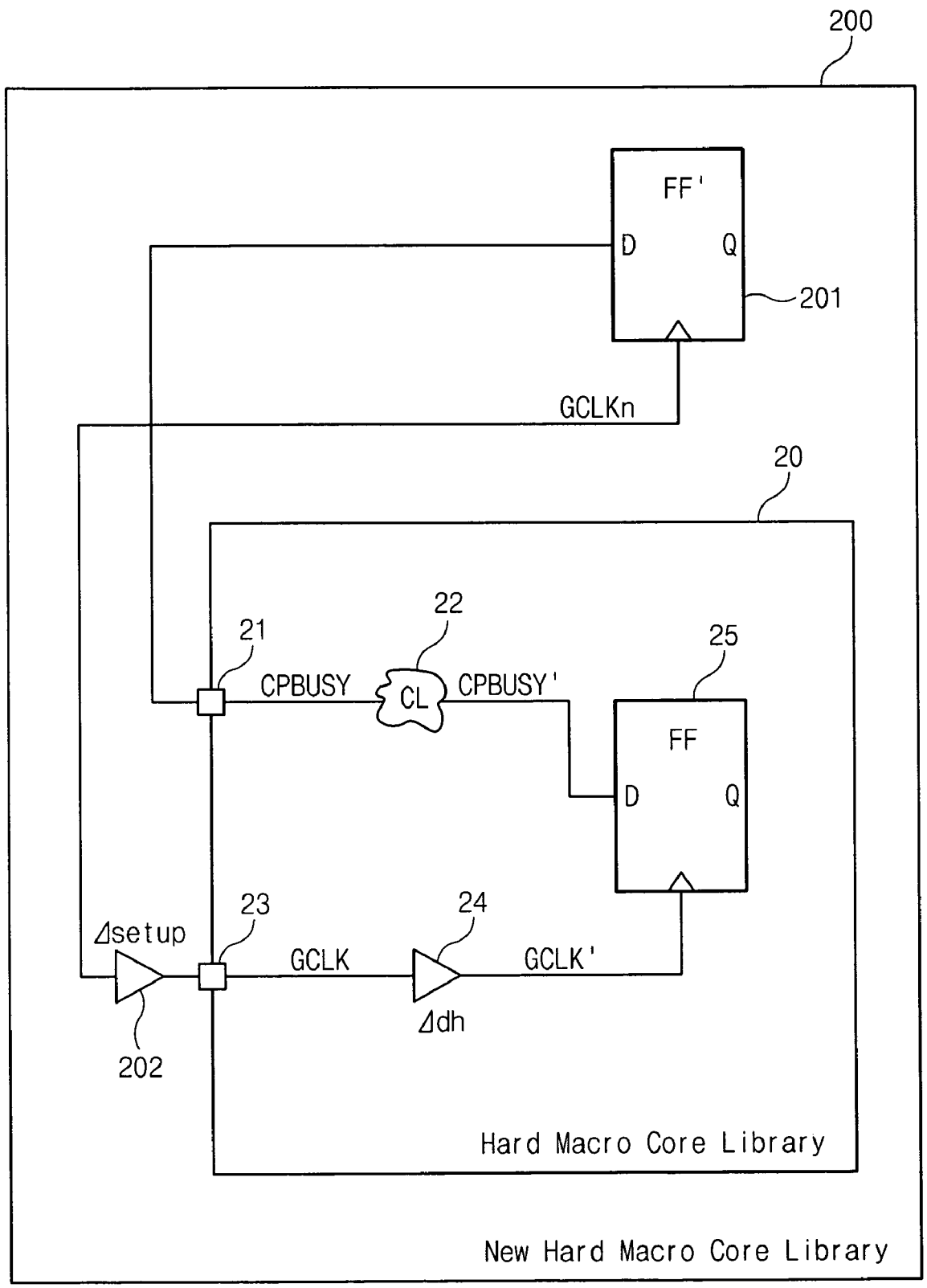
FIG. 7 illustrates an exemplary method of simulating the HMC.

FIG. 7 illustrates an exemplary method of simulating the HMC.

As illustrated in FIG. 3, the HMC 20 may include input terminals 21 and 23 for receiving a signal CPBUSY and a clock signal GCLK, respectively, a combination logic circuit 22 and a flip flop 25. The clock signal GCLK received by an input terminal 23 is applied to a clock terminal of the flip flop 25 after a CTS is performed. The signal CPBUSY received by an input terminal 21 is delayed by a combination logic circuit 22 and outputted. The flip flop 25 latches a signal CPBUSY' from a combination logic circuit 22 in response to a clock signal GCLK' generated from the buffer 24 with a delay time Δdh from the clock signal GCLK received by an input terminal 12.

Figure 8:
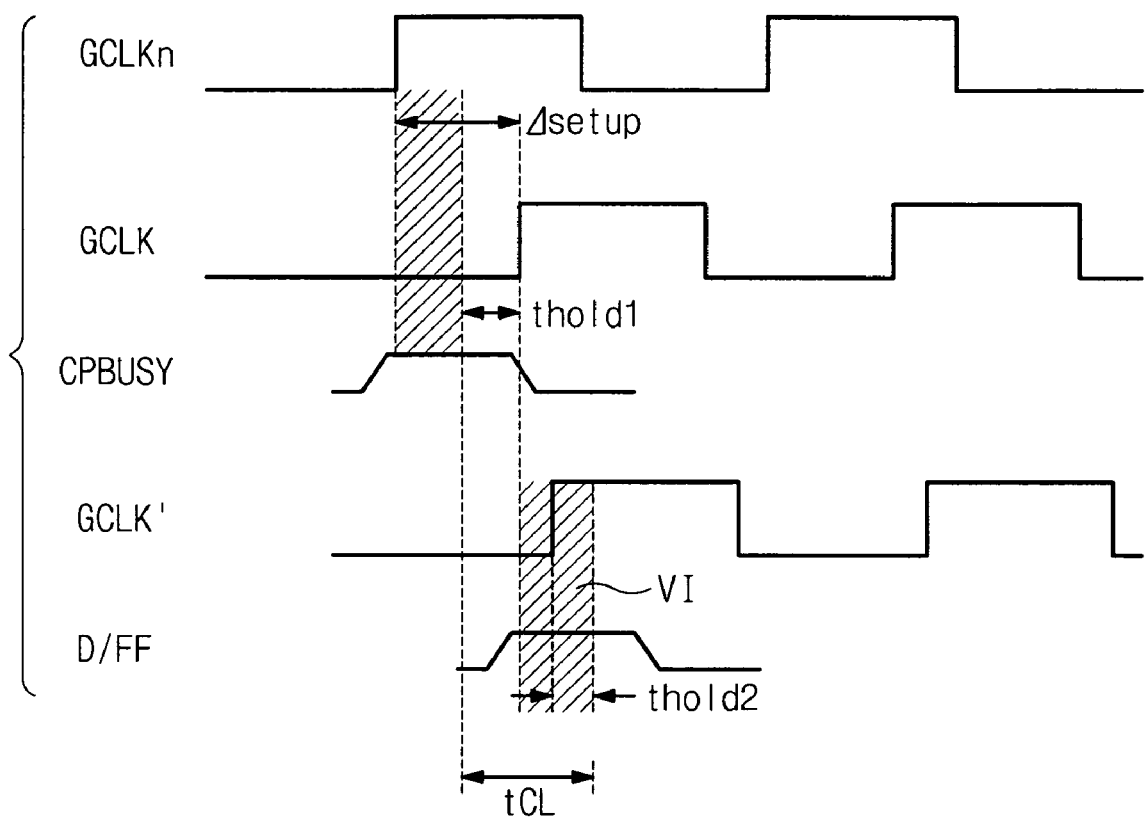
FIG. 8 illustrates a hold time of the HMC library shown in FIG. 7.

Referring to FIG. 9B, in S310, a determination is made on whether a negative hold time exists. If a negative hold time is determined to exist, the control proceeds to S311. As illustrated in FIG. 8, a hold time thold of the signal CPBUSY with respect to a clock signal GCLK may be negative.

In S311, a determination is made on whether there is a device for receiving the signal CPBUSY received by an input terminal 21 with a negative hold time. A flip flop 25 receives the signal CPBUSY as a data signal.

In S312, a clock signal GCLKn is generated, which has a phase preceding the phase of the clock signal GCLK. GCLKn is created later than GCLKn by a delay time Δsetup. The delay time Δsetup is a setup time of the signal CPBUSY with respect to a clock signal GCLK.

In S313, GCLKn is received and a flip flop 201 with a hold time (Δsetup+thold1) is generated. FIG. 8 illustrates a time corresponding to Δsetup+thold1 as being shaded. The hold time Δsetup+thold1 represents a minimum effective interval VI for which the data may received.

In S314, a new HMC library 200 is generated by integrating the generated flip flop 201 and the buffer 202 with the HMC library 20.

In S315, the new HMC library 200 is simulated by the HDL simulator.

The following is HDL code which represents an exemplary embodiment of the present invention:

```
module New_HMCore
//comment : new FF considering new_setup_time
delay delta_d_setup (.A(HCLK), .Y(HCLKn));
FF FF_new_setup (.D(ADDR), .CK(HCLKn), Q( ));
dk_setup_FF_new ( D, HCLKn, tsetup_new)
//comment : new FF considering new_hold_time
delay delta_d_hold (.A(GCLKn), .Y(GCLK));
FF FF_new_hold (.D(CPBUSY), .CK(GCLKn), Q( ));
dk_hold_FF_new ( D, GCLKn, thold_new)
    //original HMC Library
    HM_Core HM_Core_inst
(.HCLK(HCLK), .ADDR(ADDR),
GCLK(GCLK), .CPBUSY(CPBUSY) ... );
    endmodule
```

New flip flops for an HM_Core library are defined and a determination of a negative setup/hold timing are integrated in the new HMC New-HMCore module. The HDL simulator checks the setup time and/or the hold time timings with respect to the new HMC New_HMCore module. If the setup time and/or hold time of the signals ADDR and CPBUSY are determined to be negative, the HDL simulator recognizes the setup time and/or hold time as "0", and automatically checks a setup time and/or hold time with respect to a new flip flop, instead of the signals ADDR and CPBUSY with a negative setup/hold time. Therefore, an accurate timing check is possible with respect to the HMC. Thus, the timing of the setup time and/or hold time orients itself to a device for which a negative setup time and/or may be interpreted as positive, wherein a previous device the setup time and/or hold time was oriented to was interpreted as negative.

According to another exemplary embodiment of the present invention, the accuracy of HDL simulation is improved by achieving accurate timing information with respect to a HMC.

The exemplary embodiments of the present invention being thus described, it will be obvious that the same may be varied in many ways. For example, additional electronic circuit devices may create additional negative parameters. It is within the scope of the present invention to apply the teachings described above in order to incorporate additional negative parameters without losing accuracy.

Further, it should be noted that FIGS. 1, 3, 5 and 7 illustrate exemplary embodiments of electronic circuit devices. However, any electronic circuit device comprising negative parameters capable of being simulated with an HDL simulation is within the scope of the present invention.

Additionally, the negative parameters of the present invention may include, but are not limited to, setup time and/or hold time. Other parameters, for example circuit propagation time and clock synchronization offsets, are within the scope of the present invention.

Further, the HDL module HDL New_HMCore is an exemplary embodiment of the present invention. However, there are numerous variations of HDL code that can accomplish a similar result.

Such variations are not to be regarded as departure from the spirit and scope of the exemplary embodiments of the present invention, and all such modifications as would be obvious to one skilled in the art are intended to be included within the scope of the following claims.

For example, the functional blocks in FIGS. 9A and 9B as well as the HDL module HDL New_HMCore describe exemplary aspects of the present invention that may be implemented in hardware and/or software. The hardware/software implementations may include a combination of processor(s) and article(s) of manufacture. The article(s) of manufacture may further include storage media and executable computer program(s). The executable computer program(s) may include the instructions to perform the described operations or functions. The computer executable program(s) may also be provided as part of externally supplied propagated signal(s). Such variations are not to be regarded as departure from the spirit and scope of the exemplary embodiments of the present invention, and all such modifications as would be obvious to one skilled in the art are intended to be included within the scope of the following claims.

What is claimed is:

1. A method of HDL simulation for simulating a Hard Macro Core (HMC), comprising:
    determining whether there is a first electronic circuit device for receiving a signal with a negative setup time; and
    generating a second electronic circuit device for receiving the signal without losing accuracy.

2. The method of claim 1, wherein a first clock signal is received by the HMC and a second clock signal is received by the first electronic circuit device.

3. The method of claim 2, wherein the second electronic circuit device receives a clock signal which is delayed by a delay time between the first clock signal and the second clock signal.

4. The method of claim 2 wherein the first and second clock signals have given delay times.

5. The method of claim 1 wherein the first electronic circuit device has the same setup time as the second electronic circuit device.

6. The method of claim 5 wherein the first electronic circuit device operates in response to a signal having the same phase as a clock signal received by the first electronic circuit device.

7. The method of claim 1, further comprising:
generating a first library including the HMC and the first electronic circuit device; and
applying an HDL simulation to the first library.

8. A method of HDL simulation for simulating a Hard Macro Core (HMC), comprising:
determining whether there is a first electronic circuit device for receiving a first clock signal and a first signal with a negative hold time; and
generating a second clock signal having a phase preceding a phase of the first clock signal when the first signal is determined to have a negative hold time without losing accuracy.

9. The method of claim 8, further comprising:
generating a second electronic circuit device for receiving the second clock signal, wherein the second clock signal has a hold time related to a setup time.

10. The method of claim 9, further comprising:
generating a second library including the HMC and the second electronic circuit device; and
applying the HDL simulation to the second library.

11. The method of claim 9, wherein the first electronic circuit device receives the first clock signal with delay related to the second clock signal when the first signal is determined to have a negative hold time.

12. The method of claim 11, wherein the first clock signal is delayed by a setup time.

13. A method of HDL simulation for simulating a Hard Macro Core (HMC), comprising:
determining whether there is a first electronic circuit device for receiving a signal with at least one negative parameter; and
generating a second electronic circuit device for receiving the signal without losing accuracy.

14. The method of claim 13, wherein the negative parameter is a setup time.

15. The method of claim 13, wherein the negative parameter is a hold time.

16. A method of HDL simulation for simulating a Hard Macro Core (HMC), comprising:
determining whether there is a first electronic circuit device for receiving a first signal with a negative parameter; and
generating a second signal having a phase preceding a phase of the first signal when the first signal is determined to have a negative parameter.

17. The method of claim 16, wherein the negative parameter is a setup time.

18. The method of claim 16, wherein the negative parameter is a hold time.

* * * * *